(12) United States Patent
Kawaguchi et al.

(10) Patent No.: US 9,985,400 B2
(45) Date of Patent: May 29, 2018

(54) ELECTRICAL JUNCTION BOX WITH VIBRATION SUPPRESSION FEATURE

(71) Applicant: Sumitomo Wiring Systems, Ltd., Yokkaichi, Mie (JP)

(72) Inventors: Kiyofumi Kawaguchi, Mie (JP); Yukitaka Saitou, Mie (JP); Jyun Yamaguchi, Mie (JP); Itsurou Kikkawa, Mie (JP); Yuuichi Hattori, Mie (JP); Takuya Inoue, Mie (JP)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 0 days. days.

(21) Appl. No.: 15/520,701

(22) PCT Filed: Oct. 19, 2015

(86) PCT No.: PCT/JP2015/079478
§ 371 (c)(1),
(2) Date: Apr. 20, 2017

(87) PCT Pub. No.: WO2016/063842
PCT Pub. Date: Apr. 28, 2016

(65) Prior Publication Data
US 2017/0310065 A1 Oct. 26, 2017

(30) Foreign Application Priority Data

Jan. 5, 2015 (JP) .................................. 2015-000083

(51) Int. Cl.
*H01R 33/975* (2006.01)
*B60R 16/023* (2006.01)
(Continued)

(52) U.S. Cl.
CPC ....... *H01R 33/975* (2013.01); *B60R 16/0238* (2013.01); *B60R 16/03* (2013.01); *H02G 3/08* (2013.01); *H05K 5/0226* (2013.01)

(58) Field of Classification Search
None
See application file for complete search history.

(56) References Cited

U.S. PATENT DOCUMENTS 5,381,314 A * 1/1995 Rudy, Jr. ............... H05K 7/1449
257/729
5,388,995 A * 2/1995 Rudy, Jr. ............... H05K 7/1449
361/730

(Continued)

FOREIGN PATENT DOCUMENTS

JP 2007282385 A 10/2007
JP 2008172889 A 7/2008

(Continued)

OTHER PUBLICATIONS

International Search Report dated Dec. 8, 2015 pertaining to International Application No. PCT/JP2015/079478.

*Primary Examiner* — Dimary Lopez Cruz
*Assistant Examiner* — Muhammed Azam
(74) *Attorney, Agent, or Firm* — Dinsmore & Shohl LLP

(57) ABSTRACT

An electrical junction box includes an electrical junction box main body having a mount portion and a separate attachment body removably attached to the mount portion, a pair of connectors are respectively provided on opposing surfaces of the mount portion and the attachment body are connected to each other, and a vibration suppressing member is between the opposing surfaces, the vibration suppressing member suppressing vibration of the attachment body by exerting a frictional force on the opposing surfaces.

5 Claims, 6 Drawing Sheets

(51) Int. Cl.
  *H05K 5/02* (2006.01)
  *B60R 16/03* (2006.01)
  *H02G 3/08* (2006.01)

(56) References Cited

U.S. PATENT DOCUMENTS

| | | | | |
|---|---|---|---|---|
| 5,415,308 | A * | 5/1995 | Oda | H02G 3/08 220/3.2 |
| 5,928,004 | A * | 7/1999 | Sumida | B60R 16/0238 439/76.2 |
| 6,558,190 | B1 * | 5/2003 | Pierson, Jr. | H01R 9/226 439/535 |
| 6,727,429 | B1 * | 4/2004 | Koessler | H02G 3/088 174/50 |
| 6,923,660 | B2 * | 8/2005 | Takeuchi | H01R 13/506 439/76.2 |
| 7,035,105 | B2 * | 4/2006 | Yamaguchi | B60R 16/0238 165/80.3 |
| 7,167,360 | B2 * | 1/2007 | Inoue | G06F 1/181 174/544 |
| 7,333,343 | B2 * | 2/2008 | Olzak | F16L 5/04 174/544 |
| 8,520,390 | B2 * | 8/2013 | Okamoto | H01P 1/218 174/544 |
| 9,686,877 | B2 * | 6/2017 | Tokumasu | H05K 5/0221 |
| 2002/0146918 | A1 * | 10/2002 | Kondo | H01R 12/7047 439/59 |
| 2003/0047364 | A1 * | 3/2003 | Lipman | B60R 16/04 180/68.1 |
| 2003/0171039 | A1 * | 9/2003 | Pierson, Jr. | H01R 9/22 439/709 |
| 2004/0045960 | A1 * | 3/2004 | Rose | H02G 3/08 220/3.9 |
| 2004/0094319 | A1 * | 5/2004 | Koessler | H02G 3/081 174/50 |
| 2004/0244212 | A1 * | 12/2004 | Melittas | B25H 7/04 33/528 |
| 2008/0166909 | A1 * | 7/2008 | Kubota | H01R 13/6271 439/376 |
| 2008/0247133 | A1 * | 10/2008 | Ito | H01H 50/021 361/730 |
| 2013/0203285 | A1 * | 8/2013 | Solon | H01R 13/46 439/540.1 |
| 2013/0343018 | A1 * | 12/2013 | Hattori | H05K 5/0026 361/755 |
| 2014/0020948 | A1 * | 1/2014 | Kamigaichi | H02G 3/08 174/535 |
| 2014/0273554 | A1 * | 9/2014 | Sugimoto | B60R 16/0238 439/76.2 |
| 2015/0016028 | A1 * | 1/2015 | Darr | H02G 3/10 361/626 |
| 2017/0310065 | A1 * | 10/2017 | Kawaguchi | B60R 16/03 |

FOREIGN PATENT DOCUMENTS

| | | |
|---|---|---|
| JP | 2011091948 A | 5/2011 |
| JP | 2014003851 A | 1/2014 |

\* cited by examiner

ELECTRICAL JUNCTION BOX WITH VIBRATION SUPPRESSION FEATURE

CROSS-REFERENCE TO RELATED APPLICATIONS

This application is the U.S. national stage of PCT/JP2015/079478 filed Oct. 19, 2015, which claims priority of Japanese Patent Application No. JP2014-215846 filed Oct. 23, 2014 and Japanese Patent Application No. JP2015-000083 filed Jan. 5, 2015.

FIELD OF THE INVENTION

The present invention relates to an electrical junction box that is to be installed in an automobile or the like, and particularly relates to an electrical junction box in which a separate attachment body such as a controller is assembled to an electrical junction box main body through a rotating operation and connected thereto via a connector.

BACKGROUND

In electrical junction boxes that are installed in automobiles and the like, a wiring board on which an electronic component, for example, is mounted, an insulation board equipped with a busbar, and the like are accommodated. As one kind of such electrical junction boxes, an electrical junction box is known in which an electronic control unit such as an ECU that accommodates a control circuit is used as a separate attachment body and is removably mounted to a mount portion of an electrical junction box main body. Since the electronic control unit is provided as a separate structure, such an electrical junction box has an advantage in that the electronic control unit can be easily replaced or changed, and so on.

In such electrical junction boxes, in order to improve the ease of operations for attaching and removing the attachment body to and from the mount portion of the electrical junction box main body, a configuration is employed in which the attachment body and the mount portion are rotatably assembled to each other via a removable hinge mechanism. Specifically, as disclosed in JP 2008-172889A, for example, a removable hinge mechanism constituted by a bearing and a shaft portion is provided on one end side of the mount portion and the attachment body, and in a state in which the shaft portion is inserted into and temporarily engaged with the bearing, the attachment body is rotated toward the mount portion. A lock mechanism constituted by a locking portion and a locked portion is provided on the other end side of the mount portion of the electrical junction box main body and the attachment body. Then, at a rotating end where opposing surfaces of the mount portion and the attachment body are placed one on top of the other, the attachment body is removably attached and fixed to the mount portion of the electrical junction box main body by means of the hinge mechanism provided on the one end side and the lock mechanism provided on the other end side. At this time, an electric circuit provided in the electrical junction box main body and an electric circuit provided in the attachment body are connected to each other by connecting connectors provided in the respective opposing surfaces.

However, in the hinge mechanism, which is provided on the one end side of the mount portion and the attachment body, a slight gap needs to be provided between the bearing and the shaft portion so as to allow rotation of the bearing and the shaft portion. Moreover, in the lock mechanism as well, which is provided on the other end side of the mount portion and the attachment body, a slight gap needs to be provided between the locking portion and the locked portion so as to allow the locked portion to pass over and engage with the locking portion as a result of elastic deformation and elastic return of the locking portion. Therefore, there is an inherent problem in that when vibrations from a vehicle body are transmitted when, for example, the vehicle is travelling, the attachment body vibrates relative to the electrical junction box main body due to the gaps in the hinge mechanism and the lock mechanism.

In addition, within a specific frequency range, resonance of the attachment body occurs and causes a significant increase in vibration acceleration applied to the attachment body as compared with vibration acceleration applied to the electrical junction box main body, and this results in the application of a large load on terminals of the connectors that connect the electrical junction box main body and the attachment body to each other. Consequently, breakage or the like of the terminals occurs, and thus there also is a risk that the stability of conduction between the electrical junction box main body and the attachment body is unable to be ensured.

Herein, the present invention was made in view of the above-described circumstances, and it is an object thereof to provide an electrical junction box including an attachment body that is assembled to an electrical junction box main body through a rotating operation, and having a novel structure that makes it possible to suppress vibration of the attachment body relative to the electrical junction box main body and advantageously ensure the stability of conduction between the electrical junction box main body and the attachment body.

SUMMARY OF INVENTION

Hereinafter, aspects of the present invention that were made to achieve the above-described object will be described. It should be noted that constituent elements that are employed in the aspects described below can be employed in any combination whenever possible.

A first aspect of the present invention is an electrical junction box including an electrical junction box main body that has a mount portion, and a separate attachment body that is removably attached to the mount portion, wherein a pair of connectors respectively provided on opposing surfaces of the mount portion and the attachment body are connected to each other, a vibration suppressing member is sandwiched between the opposing surfaces of the mount portion and the attachment body, the vibration suppressing member suppressing vibration of the attachment body by exerting a frictional force on the opposing surfaces, the mount portion and the attachment body are rotatably assembled to each other on one end side via a removable hinge mechanism, the hinge mechanism includes a bearing provided on the one end side of the mount portion and a shaft portion provided on the one end side of the attachment body, and the vibration suppressing member is disposed in the vicinity of the bearing and the shaft portion and sandwiched between the opposing surfaces.

According to this aspect, the mount portion and the attachment body are assembled to each other with the vibration suppressing member sandwiched between the opposing surfaces thereof, and this vibration suppressing member is configured to suppress vibration of the attachment body by exerting a frictional force on the opposing surfaces. Accordingly, when vibrations are transmitted to the electrical junction box, even if a force that causes displacement of the attachment body relative to the electrical junction box main body is applied due to a gap between the mount portion of the electrical junction box main body and the attachment body, the displacement of the attachment body is stopped due to frictional resistance of the vibration suppressing member, and thus, vibration of the attachment body is suppressed or avoided. As a result, application of an excessively large vibration acceleration to the attachment body is advantageously avoided, and problems such as breakage of terminals of the connectors, which connect the electrical junction box main body and the attachment body to each other, can be prevented from occurring. Furthermore, according to this aspect, the vibration suppressing member is disposed in the vicinity of the bearing and the shaft portion, which constitute the hinge mechanism. The vicinity of the bearing and the shaft portion, of the hinge mechanism, is separated from a lock mechanism on the other end side where the tolerance with respect to a gap dimension is large, and engagement between the bearing and the shaft portion makes it possible to maximally stably obtain a compressed dimension of the vibration suppressing member between the opposing surfaces that are brought close to each other. Therefore, a sandwiching force between the opposing surfaces can be advantageously exerted on the vibration suppressing member. As a result, a normal reaction N exerted on the vibration suppressing member and each of the opposing surfaces can be increased, and thus, the effect of suppressing vibration can be advantageously enhanced by increasing a frictional force F (F=µN).

A second aspect of the present invention is the electrical junction box according to the first aspect, wherein the mount portion and the attachment body are rotatably assembled to each other on one end side via a removable hinge mechanism, the hinge mechanism includes a bearing provided on the one end side of the mount portion and a shaft portion provided on the one end side of the attachment body, and the vibration suppressing member is disposed in the vicinity of the bearing and the shaft portion and sandwiched between the opposing surfaces.

According to this aspect, the vibration suppressing member is disposed in the vicinity of the bearing and the shaft portion, which constitute the hinge mechanism. The vicinity of the bearing and the shaft portion, of the hinge mechanism, is separated from a lock mechanism on the other end side where the tolerance with respect to a gap dimension is large, and engagement between the bearing and the shaft portion makes it possible to maximally stably obtain a compressed dimension of the vibration suppressing member between the opposing surfaces that are brought close to each other. Therefore, a sandwiching force between the opposing surfaces can be advantageously exerted on the vibration suppressing member. As a result, a normal reaction N exerted on the vibration suppressing member and each of the opposing surfaces can be increased, and thus, the effect of suppressing vibration can be advantageously enhanced by increasing a frictional force F (F=µN).

A third aspect of the present invention is the electrical junction box according to the first aspect, wherein the mount portion and the attachment body are removably attached and fixed to each other on the other end side by a lock mechanism.

According to this aspect, the one end side of the mount portion and the attachment body, where the hinge mechanism is provided, is separated from the other end side, where the lock mechanism is provided. Therefore, using a separation distance (arm length), it is possible to advantageously reduce operating forces that are required for the operations to compress the vibration suppressing member between the opposing surfaces and to lock the lock mechanism, and thus even more advantageously achieve both the ease of operations for attaching and removing the attachment body and the suppression of vibration of the attachment body.

A fourth aspect of the present invention is the electrical junction box according to the first or third aspect, wherein the vibration suppressing member has a sheet-like shape, and both of a first contact surface and a second contact surface thereof are rough surfaces having protrusions and recessions, the first contact surface coming into contact with the opposing surface of the mount portion and the second contact surface coming into contact with the opposing surface of the attachment body.

According to this aspect, since both of the first/second contact surfaces of the vibration suppressing member having the sheet-like shape are rough surfaces having protrusions and recessions, it is possible to obtain an even larger frictional force between each of the opposing surfaces of the mount portion and the attachment body and a corresponding one of the contact surfaces of the vibration suppressing member by increasing the coefficient of friction.

A fifth aspect of the present invention is the electrical junction box according to the fourth aspect, wherein the first contact surface of the vibration suppressing member has a fastened portion that is fastened to the opposing surface of the mount portion via an adhesive and a pressure contact portion that is brought into pressure contact with the opposing surface of the mount portion by a sandwiching pressure.

According to this aspect, the fastened portion of the vibration suppressing member can be fastened to the opposing surface of the mount portion in advance. Therefore, the vibration suppressing member can be sandwiched between the mount portion and the attachment body by simply performing the same operation as a conventional operation, in which the attachment body is assembled to the mount portion by rotating the attachment body relative to the mount portion via the hinge mechanism, and thus the ease of operation can be improved.

Moreover, since the pressure contact portion is also provided in the first contact surface of the vibration suppressing member, after the attachment body has been assembled to the mount portion, the pressure contact portion is in pressure contact with the opposing surface of the mount portion, and thus, a large frictional force can be obtained between the opposing surface of the mount portion and the pressure contact portion of the first contact surface. Therefore, the effect of suppressing displacement of the attachment body relative to the opposing surface of the mount portion can also be stably obtained for a long period of time.

According to the present invention, the mount portion and the attachment body are assembled to each other with the vibration suppressing member sandwiched between the opposing surfaces thereof, the vibration suppressing member suppressing vibration of the attachment body by exerting a frictional force on each of the opposing surfaces. Therefore, even if vibrations are transmitted to the electrical junction box, and a force that causes displacement of the attachment body relative to the electrical junction box main body is applied, vibration of the attachment body is suppressed or avoided due to frictional resistance of the vibration suppressing member. As a result, application of an excessively large vibration acceleration to the attachment body is advantageously avoided, and problems such as breakage of the terminals of the connectors, which connect the attachment body and the electrical junction box main body to each other, can be prevented from occurring.

DETAILED DESCRIPTION OF THE PREFERRED EMBODIMENTS

Hereinafter, an embodiment of the present invention will be described with reference to the drawings.

Figure 1:
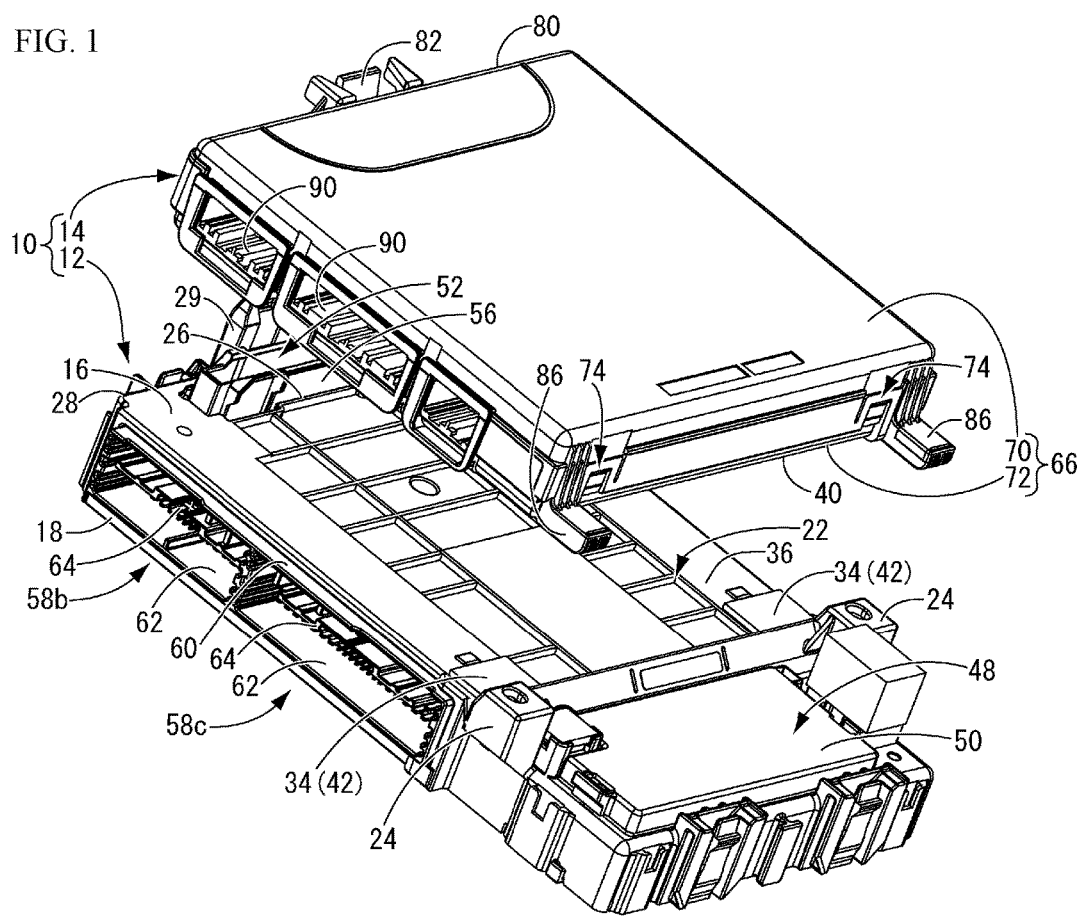
FIG. 1 is an exploded perspective view showing an electrical junction box serving as an embodiment of the present invention.

First, FIGS. 1 to 6 show an electrical junction box 10 serving as an embodiment of the present invention. As shown in FIG. 1, the electrical junction box 10 includes an electrical junction box main body 12 and an attachment body 14 that is separate from the electrical junction box main body 12. The electrical junction box main body 12 is formed from an upper case 16 and a lower case 18, and a circuit board 20 is accommodated inside those cases. It should be noted that in the following description, "upper side" refers to the upper side in FIG. 1, "lower side" refers to the lower side in FIG. 1, "front side" refers to the left-hand side in FIG. 3, and "rear side" refers to the right-hand side in FIG. 3.

Figure 3A:
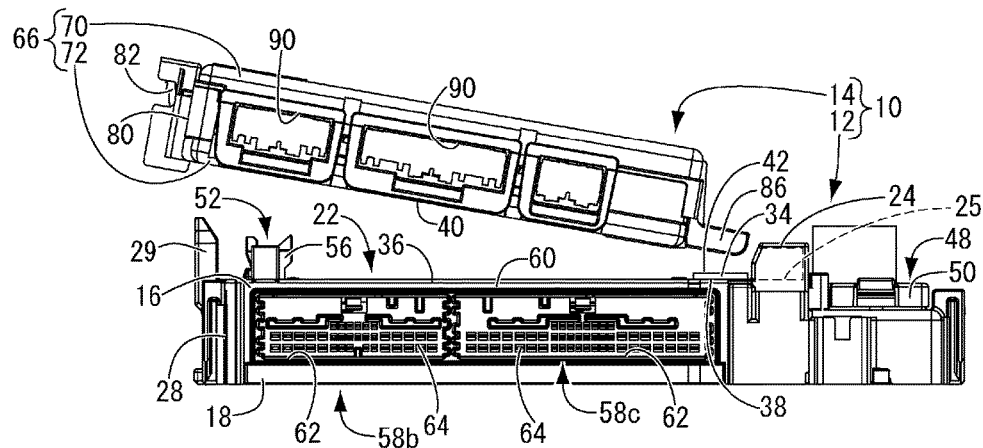
FIG. 3(a) shows side views showing respective states of the electrical junction box shown in FIG. 1 during assembly before mounting of a hinge mechanism.
Figure 3B:
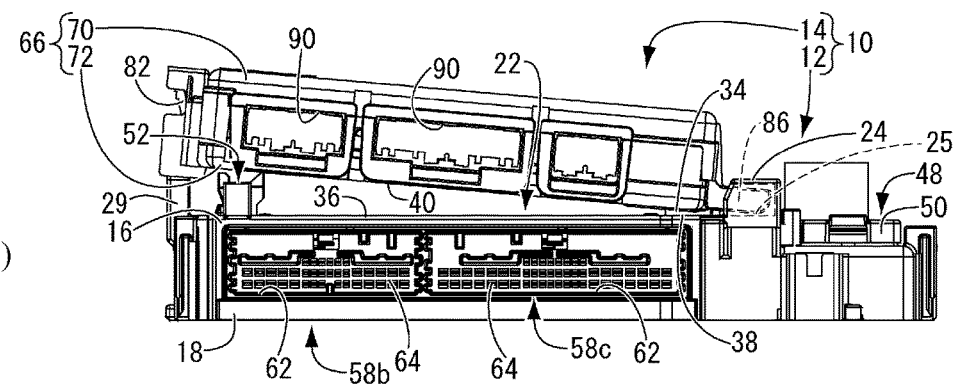
FIG. 3(b) shows side views showing respective states of the electrical junction box shown in FIG. 1 during mounting and rotation of the hinge mechanism.

The upper case 16 is an integrally molded product formed of a synthetic resin and has a substantially longitudinally-oblong rectangular box-like shape that opens downward. As shown in FIGS. 1 and 4, a mount portion 22 is formed on an upper surface of the upper case 16, and a pair of substantially block-shaped support portions 24 are provided at both end portions of the mount portion 22 with respect to a width direction thereof that are located on one end side of the mount portion 22 with respect to a longitudinal direction thereof. A bearing 25 that opens toward the front side (left-hand side in FIG. 3) so as to have a substantially rectangular cross-sectional shape is formed in each of the pair of support portions 24.

Meanwhile, on the other end side of the mount portion 22 that is opposite to the one end side, where the pair of support portions 24 are provided, with respect to the longitudinal direction (upper-lower direction in FIG. 4), an opening hole 26 is provided passing through the mount portion 22, the opening hole 26 having a substantially laterally-oblong rectangular shape extending along the other end side. Moreover, a U-shaped engagement frame 29 protruding upward is provided in a central portion of a side wall 28 of the mount portion 22 on the other end side of the mount portion 22.

In addition, on the one end side of the mount portion 22, a pair of vibration suppressing members 34 are disposed on both sides of the mount portion 22 with respect to the width direction. The vibration suppressing members 34 each have a sheet-like shape, and a first contact surface 38 that comes into contact with a surface 36 of the mount portion 22, which is a surface opposing the attachment body 14, and a second contact surface 42 that comes into contact with a bottom surface 40 of the attachment body 14, which is a surface opposing the mount portion 22, both of the first and second contact surfaces being rough surfaces having protrusions and recessions. Here, the rough surfaces having protrusions and recessions can be formed by groove portions or the like that are formed in a lattice pattern, for example. Moreover, as shown in FIG. 4, the first contact surface 38 of each vibration suppressing member 34 has a pair of fastened portions 44 that are located on both sides of the vibration suppressing member 34 with respect to a length direction thereof and fastened to the surface 36 of the mount portion 22, which is the surface opposing the attachment body 14, via an adhesive, and a pressure contact portion 46 that is located in a central portion of the vibration suppressing member 34 with respect to the length direction thereof.

The vibration suppressing members 34 are sandwiched between the surface 36 of the mount portion 22, which is the surface opposing the attachment body 14, and the bottom surface 40 of the attachment body 14, which is the surface opposing the mount portion 22, thereby exerting a frictional force on the surface 36 and the bottom surface 40 and suppressing displacement of the attachment body 14 relative to the mount portion 22, that is, vibration of the attachment body 14. Therefore, the vibration suppressing members 34 are formed of a material that has a higher coefficient of friction and a lower Young's modulus than the surface 36 and the bottom surface 40. For example, urethane rubber or EPDM is preferably employed as this material. In the case where sheet having a rough surface on only one side is used, two pieces of this sheet are bonded to each other with the rough surfaces facing outward, and in this manner, a vibration suppressing member 34 having rough surfaces on both sides can be obtained. Moreover, for example, a material having a coefficient of friction of 3.0 or more, a Young's modulus of 0.5 to 10 MPa, and a compression set of 40% or less can be used as the above-described material. In this connection, polypropylene (PP), which is commonly used as a synthetic resin composing the opposing surfaces 36 and 40, has a coefficient of friction of about 0.3 and a Young's modulus of about 1500 to 2000 MPa.

The lower case 18 is an integrally molded product formed of a synthetic resin. As shown in FIGS. 1 and 4, the lower case 18 has a substantially box-like shape that has substantially the same shape as the upper case 16 in plan view and that opens upward.

The circuit board 20 has a plate-like shape that has substantially the same longitudinally-oblong rectangular shape as the lower case 18 in plan view. Various electrical components such as a relay, for example, are appropriately provided on a central portion of the circuit board 20. A fuse module 48 is provided on the one end side of the circuit board 20 with respect to the longitudinal direction. A plurality of fuse mount portions, which are not shown, are formed in the fuse module 48. It should be noted that the fuse module 48 is configured so that a cover member 50 is assembled thereto, and when opening portions of the fuse mount portions are covered by the cover member 50, the inside of the fuse mount portions are protected. Meanwhile, on the other end side of the circuit board 20 with respect to the longitudinal direction, a main body-side connector 52 extending upward and having a substantially laterally-oblong rectangular shape is disposed along the one end side. As shown in FIGS. 1 and 4, the main body-side connector 52 includes rod-shaped male terminals 54 for electrical connection to the attachment body 14 and a connector housing 56 that is made of a synthetic resin and that is formed into a substantially rectangular tube-like shape, surrounding the male terminals 54.

Figure 2:
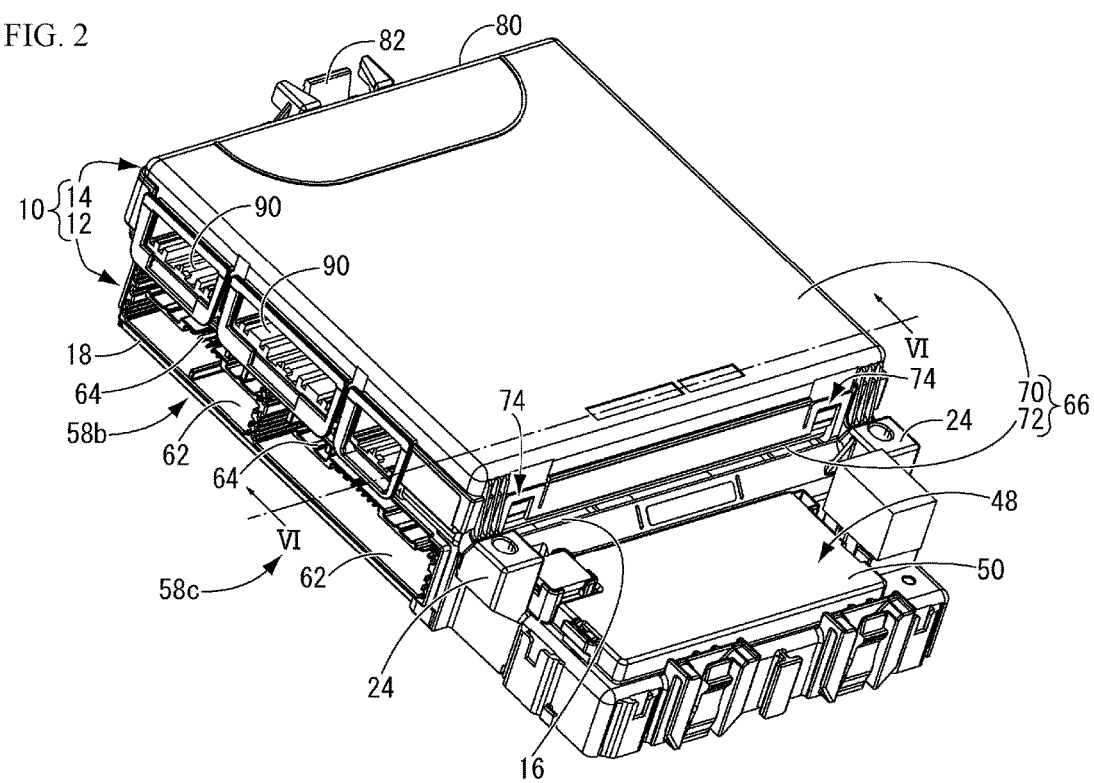
FIG. 2 is a perspective view showing the electrical junction box shown in FIG. 1 after having been assembled.

Moreover, as shown in FIG. 4, a lateral connection type connector 58a is disposed in one lateral edge portion (on the right-hand side in FIG. 4) of the circuit board 20, the lateral edge portion extending in the longitudinal direction. Meanwhile, a side wall member 60 is disposed in the other lateral edge portion (on the left-hand side in FIG. 4) of the circuit board 20, the lateral edge portion extending in the longitudinal direction of the circuit board 20. The side wall member 60 is an integrally molded product made of a synthetic resin and has an elongated shape. As shown in FIGS. 1 and 2, in the side wall member 60, two connector accommodating portions 62 that each have a rectangular recessed shape and that open toward an outer side of the circuit board 20 are formed so as to be adjacent to each other in the longitudinal direction. As in the case of the above-described lateral connection type connector 58a, a plurality of board terminals 64 bent into an L-shape are inserted into the connector accommodating portions 62, and thus, these connector accommodating portions 62 form lateral connection type connectors 58b and 58c, respectively.

The circuit board 20 having the above-described configuration is accommodated between the upper case 16 and the lower case 18, and thus the electrical junction box main body 12 is configured. Moreover, as shown in FIGS. 1 and 4, the main body-side connector 52, which is provided on the circuit board 20, protrudes above the mount portion 22 through the opening hole 26 formed in the mount portion 22.

The attachment body 14 is an electronic control unit of a vehicle, such as an ECU, and when attached and electrically connected to the electrical junction box main body 12, the attachment body 14 receives power supply from the electrical junction box main body 12 and controls electronic components, such as a relay, mounted in the electrical junction box main body 12. It should be noted that the electrical junction box 10 as used in the present invention includes a junction block, a fuse box, a relay box, and the like.

As shown in FIGS. 1 to 6, the attachment body 14 has a structure in which a circuit board 68 is accommodated inside a housing 66 formed of a synthetic resin. The housing 66 has a hollow box structure in which an upper case 70 and a lower case 72 having substantially rectangular open box-like shapes are placed one on top of the other in a state in which an opening portion of one of those cases is covered by the other case and vice versa, and are fixed to each other through locking at locking portions 74. Moreover, the housing 66 has substantially the same rectangular shape as the mount portion 22 of the electrical junction box main body 12 in plan view, and in a state in which the attachment body 14 is attached to the electrical junction box main body 12, the bottom surface 40 of the housing 66 constitutes a surface that is placed on top of the mount portion 22.

Figure 5:
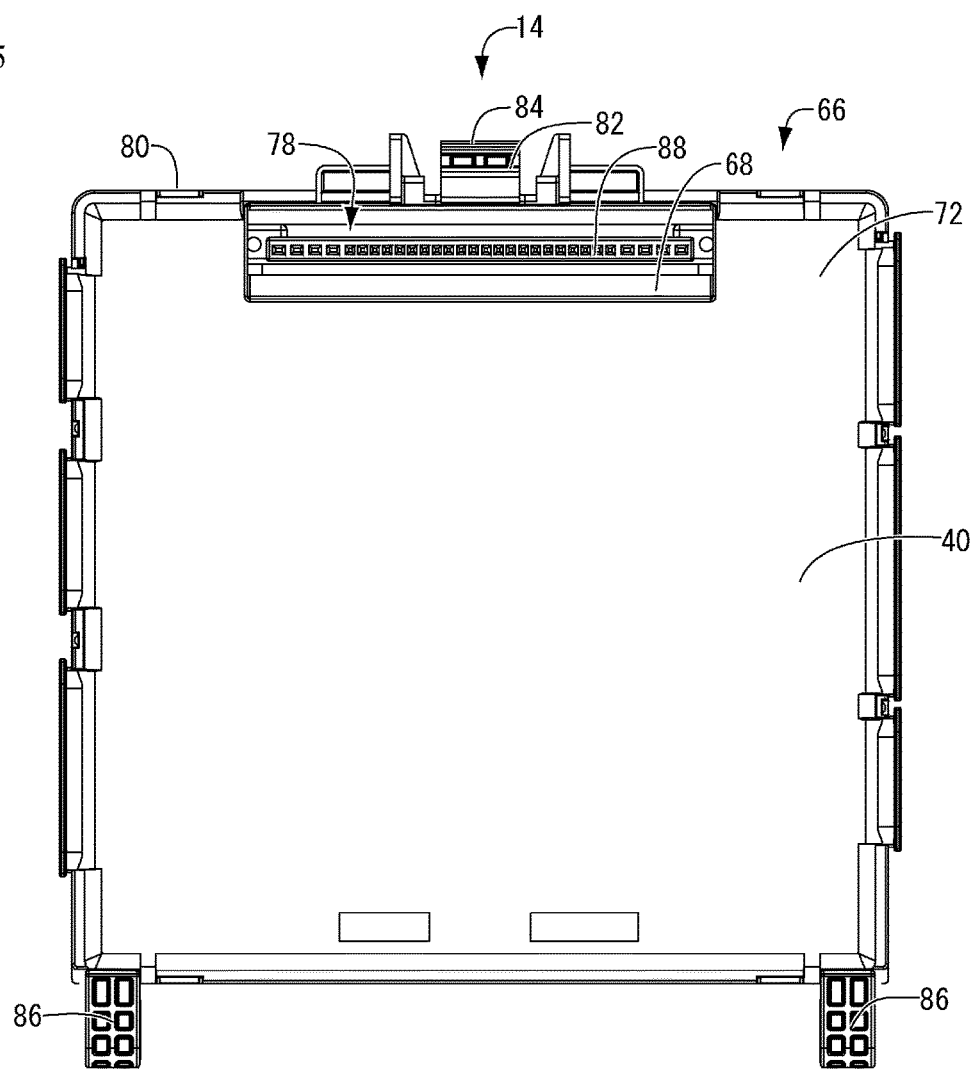
FIG. 5 is a bottom view of an attachment body shown in FIG. 1.
Figure 6:
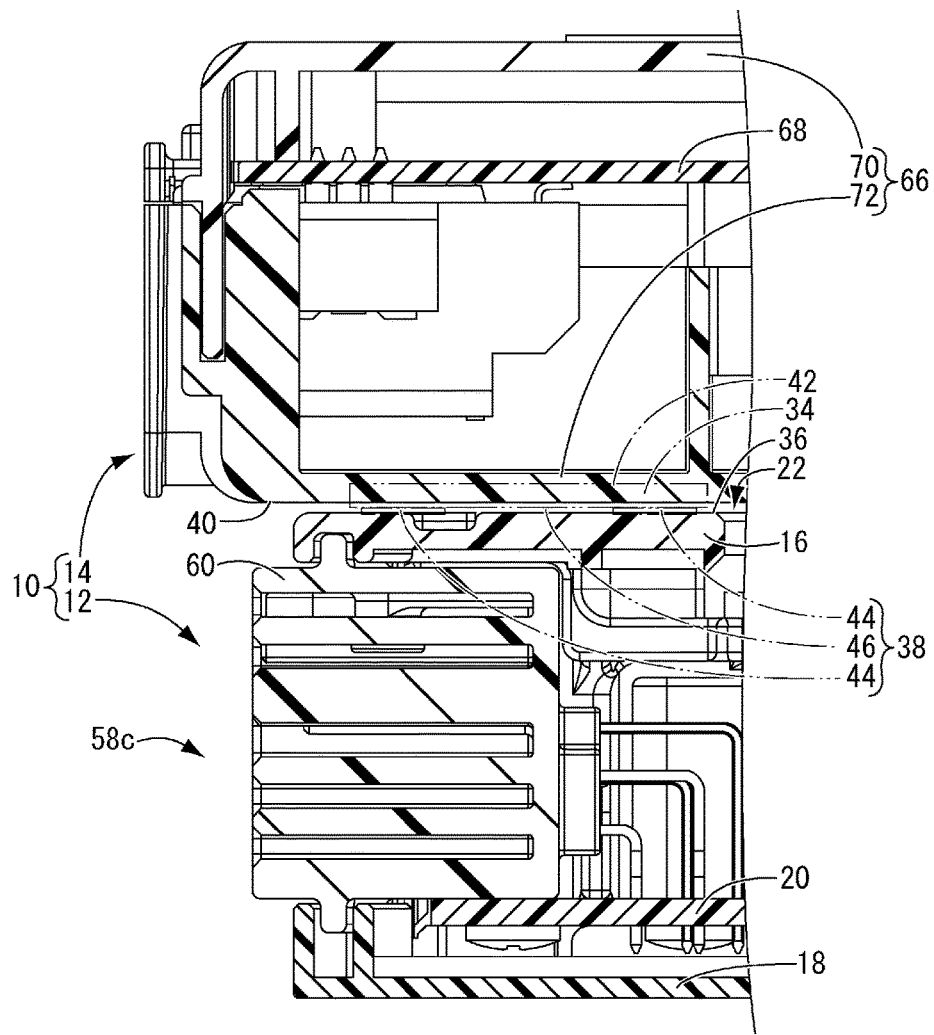
FIG. 6 is an enlarged view of a relevant portion of cross section VI-VI in FIG. 2.

As shown in FIG. 5, the circuit board 68 accommodated in the housing 66 is provided with an attachment body-side connector 78 to be connected to the main body-side connector 52 provided on the circuit board of the electrical junction box main body 12. The attachment body-side connector 78 extends along the other end side (upper side in FIG. 5) of the housing 66, and in a state in which the bottom surface 40 of the housing 66 opposes the mount portion 22 of the electrical junction box main body 12 so as to be parallel thereto, the attachment body-side connector 78 is located at a position opposing the main body-side connector 52 and protrudes toward the main body-side connector 52. Moreover, an elastic locking piece 82 is provided protruding upward and slightly diagonally forward from a side wall 80 of the housing 66 that is located on the other end side, the elastic locking piece 82 being connected to a lower end portion of the side wall 80 in a cantilevered manner. An engagement protrusion 84 is provided protruding outward from a protruding leading end portion of the elastic locking piece 82. Meanwhile, a pair of shaft portions 86 each having a substantially rectangular cross-sectional shape are provided protruding outward from both end portions of the housing 66 on the one end side (lower side in FIG. 5) that is opposite to the other end side.

The electrical junction box main body 12 and the attachment body 14 having the above-described structures are assembled to each other in the following manner. First, as shown in FIG. 3(a), the attachment body 14 is oriented such that the bottom surface 40 opposes the mount portion 22 of the electrical junction box main body 12, and in this state, the pair of shaft portions 86 are inserted into the respective bearings 25 of the pair of support portions 24 of the electrical junction box main body 12 (see FIG. 3(b)). Thus, a hinge mechanism is constituted by the pair of shaft portions 86, which are provided on the one end side of the attachment body 14, and the pair of bearings 25, which are provided on the one end side of the mount portion 22. That is to say, the mount portion 22 and the attachment body 14 are rotatably assembled to each other on the one end side via the removable hinge mechanism. In this state, the longitudinal direction of the main body-side connector 52 and the longitudinal direction of the attachment body-side connector 78 extend parallel to an extended direction (direction perpendicular to the paper plane in FIG. 3) of the pair of shaft portions 86 serving as the axis of rotation of the attachment body 14. Then, the bottom surface 40 of the attachment body 14 is brought close to the mount portion 22 of the electrical junction box main body 12 by rotating the attachment body 14 about the pair of shaft portions 86. It should be noted that the rotating operation of the attachment body 14 involves a rotating operation of the pair of shaft portions 86 and a sliding operation in which the pair of shaft portions 86 are gradually inserted further into the pair of bearings 25, and therefore a smooth rotating operation of the attachment body 14 is realized.

In this manner, the pair of shaft portions 86, which are provided on the one end side of the attachment body 14, are rotated while being supported by the pair of bearings 25, which are also provided on the one end side of the electrical junction box main body 12, and thus, the attachment body 14 is placed on top of the mount portion 22. As a result, the engagement protrusion 84 of the elastic locking piece 82, which is provided on the other end side of the attachment body 14, engages with the engagement frame 29, which is also provided on the other end side of the electrical junction box main body 12. Thus, the attachment body 14 is fixed to the electrical junction box main body 12, and the assembly is completed. In this assembled state, the attachment body-side connector 78, which is provided in the attachment body 14, is inserted into the main body-side connector 52, which protrudes from the mount portion 22, and the male terminals 54, which are disposed inside the main body-side connector 52, are connected to female terminals 88 that are disposed inside the attachment body-side connector 78. Thus, the circuit board 20 of the electrical junction box main body 12 and the circuit board 68 of the attachment body 14 are electrically connected to each other. It should be noted that the locking between the engagement protrusion 84 and the engagement frame 29 can be released by pressing the leading end portion of the elastic locking piece 82 toward the side wall 80. Therefore, the other end side of the mount portion 22 and the other end side of the attachment body 14 can be removably attached and fixed to each other by means of the lock mechanism, which is constituted by the engagement protrusion 84 and the engagement frame 29. Moreover, connector mount portions 90 are provided in a lateral side surface of the attachment body 14, so that connectors, which are not shown, can be connected to these connector mount portions 90 and the lateral connection type connectors 58a to 58c, which are provided in the electrical junction box main body 12.

In addition, in this assembled state, the vibration suppressing members 34 are sandwiched between the surface 36 of the mount portion 22, which is the surface opposing the attachment body 14, and the bottom surface 40 of the attachment body 14, which is the surface opposing the mount portion 22. Thus, a sandwiching pressure due to the above-described sandwiching brings the pressure contact portion 46 of the first contact surface 38 and the second contact surface 42 into pressure contact with the surface 36 of the mount portion 22 and the bottom surface 40 of the attachment body 14, respectively. It should be noted that in FIG. 6, the vibration suppressing member 34 prior to being deformed by being sandwiched is shown in a phantom line to facilitate the understanding.

Figure 3C:
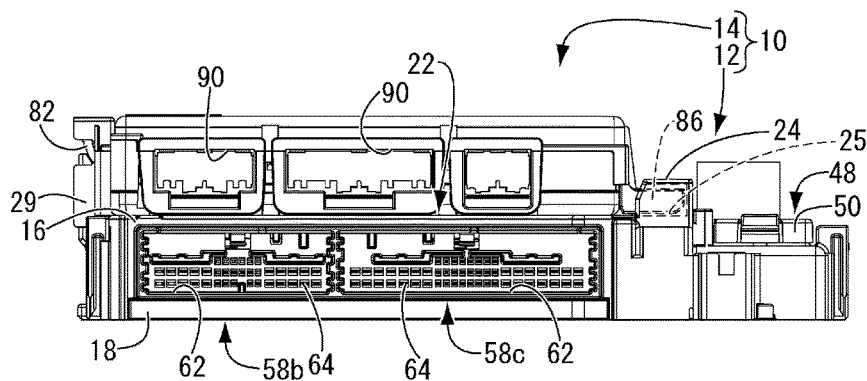
FIG. 3(c) shows side views showing respective states of the electrical junction box shown in FIG. 1 after assembly.
Figure 4:
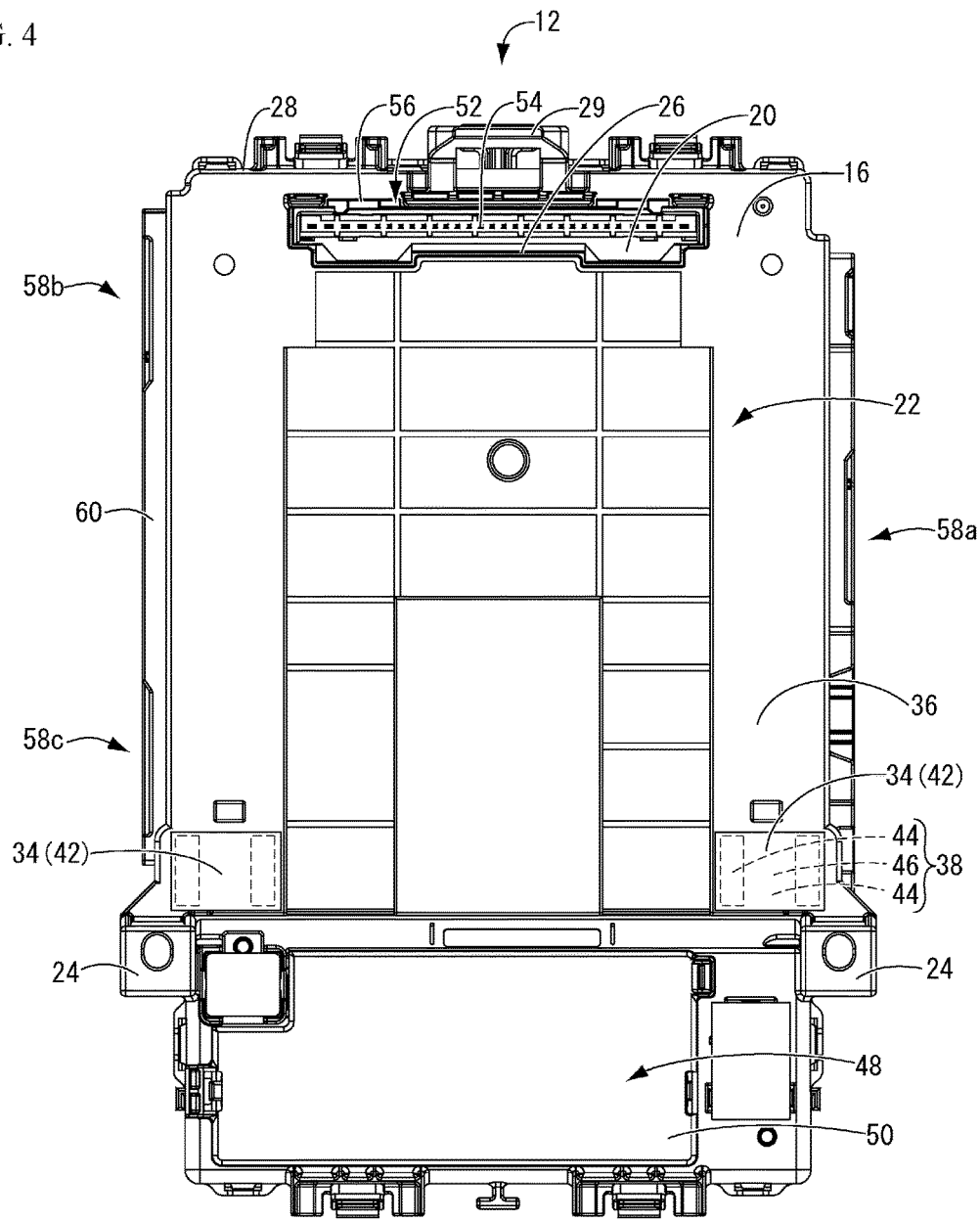
FIG. 4 is a plan view of an electrical junction box main body shown in FIG. 1.

As shown in FIG. 3, each vibration suppressing member 34 is disposed in the vicinity of a corresponding one of the bearings 25 and a corresponding one of the shaft portions 86, which constitute the hinge mechanism, and sandwiched between the opposing surfaces 36 and 40. Since the region in the vicinity of the bearing 25 and the shaft portion 86 is separated from the lock mechanism 29 and 84 on the other end side where the tolerance with respect to a gap dimension is large, it is possible to stably obtain the smallest compressed dimension of the vibration suppressing member 34 compressed between the opposing surfaces 36 and 40 when they are brought close to each other by means of the hinge mechanism 25 and 86. Thus, it is possible to increase a normal reaction N that is exerted on the vibration suppressing members 34 and the opposing surfaces 36 and 40, and it is therefore possible to advantageously enhance the effect of suppressing vibration by increasing a frictional force F ($F=\mu N$). It should be noted that as a result of the use of a material having a low Young's modulus for the vibration suppressing members 34, the compression set also tends to be small, and accordingly, it is also possible to stably obtain a desired vibration suppressing effect for a long period of time. Furthermore, operating forces that are required for the operations to compress the vibration suppressing members 34 between the opposing surfaces 36 and 40 and to lock the lock mechanism 29 and 84 can be advantageously reduced using a separation distance (arm length) between the one end side, where the hinge mechanism 25 and 86 is provided, and the other end side, where the lock mechanism 29 and 84 is provided, and therefore, it is possible to even more advantageously achieve both the ease of operations for attaching and removing the attachment body 14 and the suppression of vibration of the attachment body 14.

According to the electrical junction box 10 of the present embodiment having the above-described structure, the vibration suppressing members 34 are sandwiched between the surface 36 of the mount portion 22 and the bottom surface 40 of the attachment body 14, and a material having a higher coefficient of friction than the surface 36 of the mount portion 22 and the bottom surface 40 of the attachment body 14 is used for the vibration suppressing members 34. Thus, when vibrations are transmitted to the electrical junction box 10, even if a force that causes displacement of the attachment body 14 relative to the electrical junction box main body 12 is applied due to a gap in each of the hinge mechanism 25 and 86 and the lock mechanism 29 and 84, the displacement of the attachment body 14 relative to the electrical junction box main body 12 is stopped due to frictional resistance of the vibration suppressing members 34, and thus vibration of the attachment body 14 is suppressed or avoided. Therefore, application of an excessively large vibration acceleration to the attachment body 14 is advantageously avoided, and problems such as breakage of the terminals 54 and 88 of the pair of connectors 52 and 78, which connect the attachment body 14 and the electrical junction box main body 12 to each other, can be prevented from occurring. Moreover, as a result of the use of a material having a lower Young's modulus than the surface 36 of the mount portion 22 and the bottom surface 40 of the attachment body 14 for the vibration suppressing members 34, operating forces that are required in rotational fitting and locking fitting of the attachment body 14 to the mount portion 22 can also be reduced to a low level. That is to say, it is possible to suppress vibration of the attachment body 14 and advantageously ensure the stability of conduction between the electrical junction box main body 12 and the attachment body 14, while maintaining good ease of operations for attaching and removing the attachment body 14.

In addition, since both of the contact surfaces 38 and 42 of the individual vibration suppressing members 34 are rough surfaces having protrusions and recessions, it is possible to obtain an even larger frictional force between the surface 36 of the mount portion 22 or the bottom surface 40 of the attachment body 14 and the vibration suppressing members 34. Moreover, it is possible to fasten the fastened portions 44 of the vibration suppressing members 34 to the surface 36 of the mount portion 22 in advance. Therefore, the vibration suppressing members 34 can be sandwiched between the mount portion 22 and the attachment body 14 by simply performing an operation that is the same as a conventional operation, in which the attachment body 14 is assembled to the mount portion 22 by rotating the attachment body 14 relative to the mount portion 22 via the hinge mechanism 25 and 86, and thus, it is possible to improve the ease of operation. Furthermore, since the pressure contact portion 46 is also provided in the first contact surface 38 of each of the vibration suppressing members 34, the pressure contact portion 46 is in pressure contact with the surface 36 of the mount portion 22 after the attachment body 14 has been assembled to the mount portion 22. Therefore, a large frictional force can be obtained between the surface 36 of the mount portion 22 and the pressure contact portion 46, and thus, it is also possible to stably obtain the effect of suppressing displacement of the attachment body 14 relative to the surface 36 of the mount portion 22 for a long period of time.

Although an embodiment of the present invention has been described above, the present invention is not limited to the specific descriptions of this embodiment. For example, any known configurations can be employed as the configurations of the electrical junction box main body 12 and the attachment body 14 of the above-described embodiment.

Moreover, although the vibration suppressing members 34 of the above-described embodiment are disposed at positions that are in the vicinity of the removable hinge mechanism 25 and 86, the positions of the vibration suppressing members 34 are not necessarily limited to these positions, and any number of vibration suppressing members 34 can be disposed at any positions on the mount portion 22. Furthermore, although each of the vibration suppressing members 34 of the above-described embodiment has rough surfaces, which have protrusions and recessions, on both sides, the present invention is not limited to this embodiment, and it is also possible that each vibration suppressing member 34 has a flat surface on one side or flat surfaces on both sides, the flat surface(s) having no protrusions and recessions. Moreover, the vibration suppressing members 34 are not necessarily required to have the fastened portion 44.

The invention claimed is:

1. An electrical junction box comprising:
    an electrical junction box main body that has a mount portion; and
    a separate attachment body that is removably attached to the mount portion,
    wherein a pair of connectors respectively provided on opposing surfaces of the mount portion and the attachment body are connected to each other,
    a vibration suppressing member is sandwiched between the opposing surfaces of the mount portion and the attachment body, the vibration suppressing member suppressing vibration of the attachment body by exerting a frictional force on the opposing surfaces,
    the mount portion and the attachment body are rotatably assembled to each other on one end side via a removable hinge mechanism, and
    the hinge mechanism includes a bearing provided on the one end side of the mount portion and a shaft portion provided on the one end side of the attachment body, and the vibration suppressing member is disposed in the vicinity of the bearing and the shaft portion and sandwiched between the opposing surfaces.

2. The electrical junction box according to claim 1, wherein the mount portion and the attachment body are removably attached and fixed to each other on the other end side by a lock mechanism.

3. The electrical junction box according to claim 2, wherein the vibration suppressing member has a sheet-like shape, and both of a first contact surface and a second contact surface thereof are rough surfaces having protrusions and recessions, the first contact surface coming into contact with the opposing surface of the mount portion and the second contact surface coming into contact with the opposing surface of the attachment body.

4. The electrical junction box according to claim 1, wherein the vibration suppressing member has a sheet-like shape, and both of a first contact surface and a second contact surface thereof are rough surfaces having protrusions and recessions, the first contact surface coming into contact with the opposing surface of the mount portion and the second contact surface coming into contact with the opposing surface of the attachment body.

5. The electrical junction box according to claim 4, wherein the first contact surface of the vibration suppressing member has a fastened portion that is fastened to the opposing surface of the mount portion via an adhesive and a pressure contact portion that is brought into pressure contact with the opposing surface of the mount portion by a sandwiching pressure.

* * * * *